United States Patent
Emoto

(10) Patent No.: US 7,518,708 B2
(45) Date of Patent: Apr. 14, 2009

(54) LIQUID-IMMERSION EXPOSURE METHOD AND LIQUID-IMMERSION EXPOSURE APPARATUS

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/925,579

(22) Filed: Oct. 26, 2007

(65) Prior Publication Data

US 2008/0111979 A1    May 15, 2008

(30) Foreign Application Priority Data

Nov. 10, 2006  (JP)  ............................. 2006-305242

(51) Int. Cl.
*G03B 27/58* (2006.01)
*G03B 27/54* (2006.01)

(52) U.S. Cl. .............................. 355/72; 355/67; 378/34

(58) Field of Classification Search .................... 355/30, 355/53, 67, 72, 75; 378/34, 35; 250/492.2
See application file for complete search history.

(56) References Cited

U.S. PATENT DOCUMENTS

2007/0132976 A1* 6/2007 Nagasaka .................... 355/57

FOREIGN PATENT DOCUMENTS

| JP | 2004-289126 A | 10/2004 |
|---|---|---|
| WO | 99/49504 A1 | 9/1999 |

* cited by examiner

*Primary Examiner*—D. Rutledge
(74) *Attorney, Agent, or Firm*—Canon U.S.A., Inc. I.P. Division

(57) ABSTRACT

In a liquid-immersion exposure method and a liquid-immersion exposure apparatus, on the basis of a liquid repellency distribution at a surface which an immersion liquid contacts as a result of a movement of a stage, a path where a movement time of the stage becomes the shortest is calculated, so that the stage is moved along this path.

23 Claims, 12 Drawing Sheets

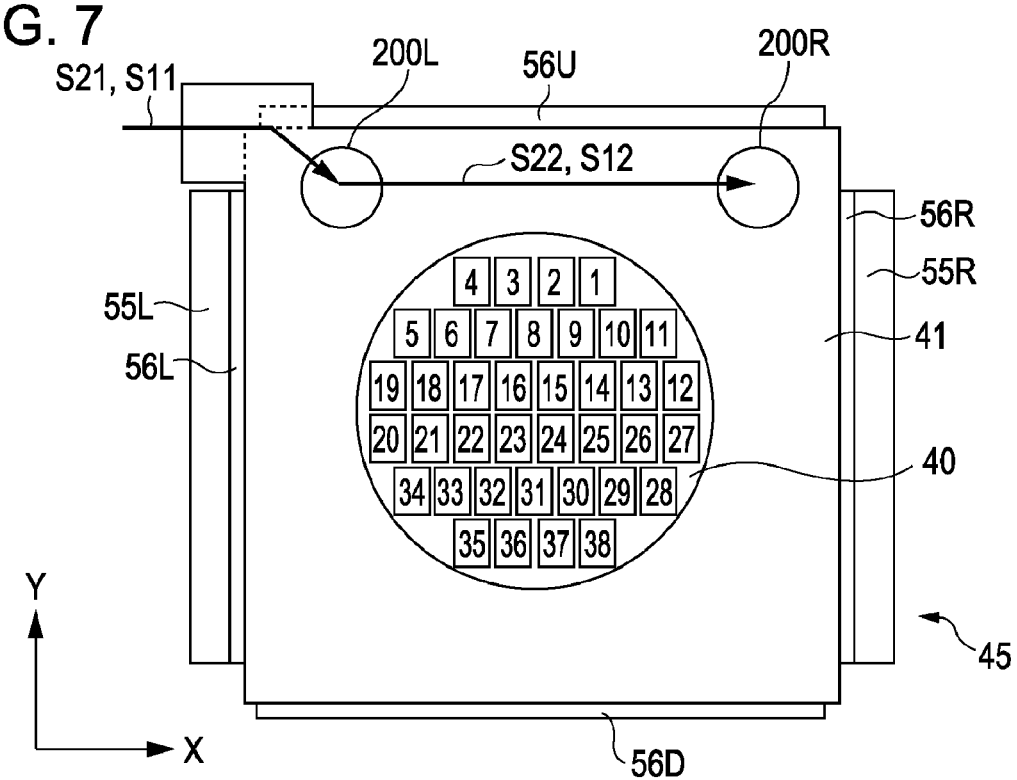
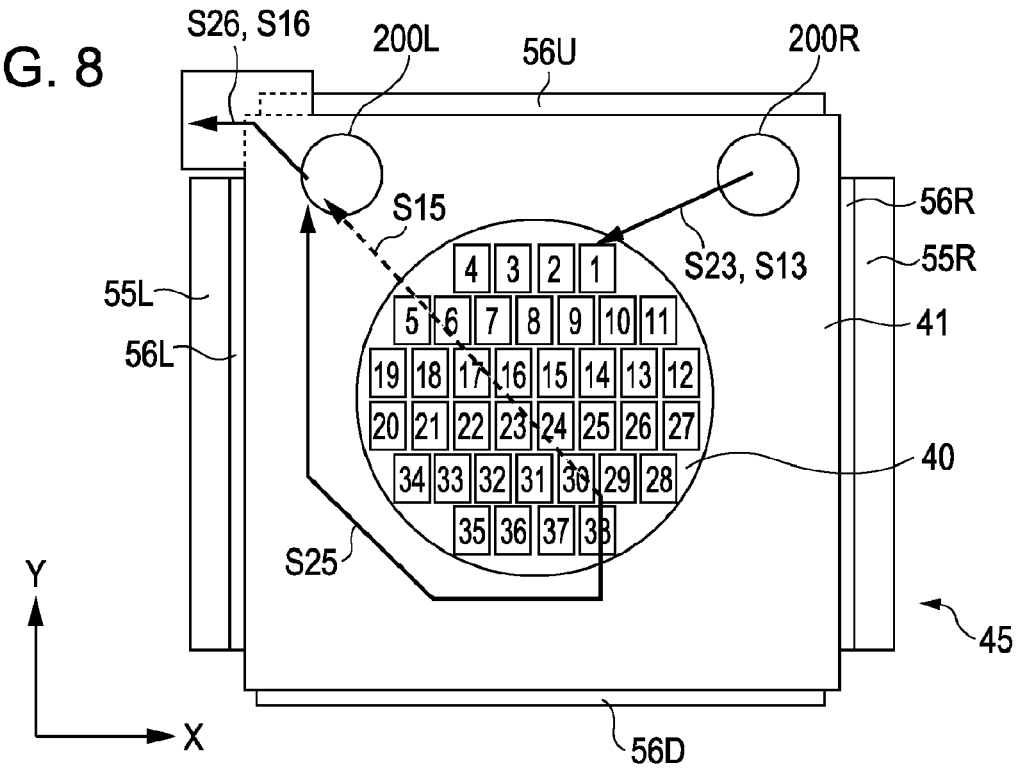

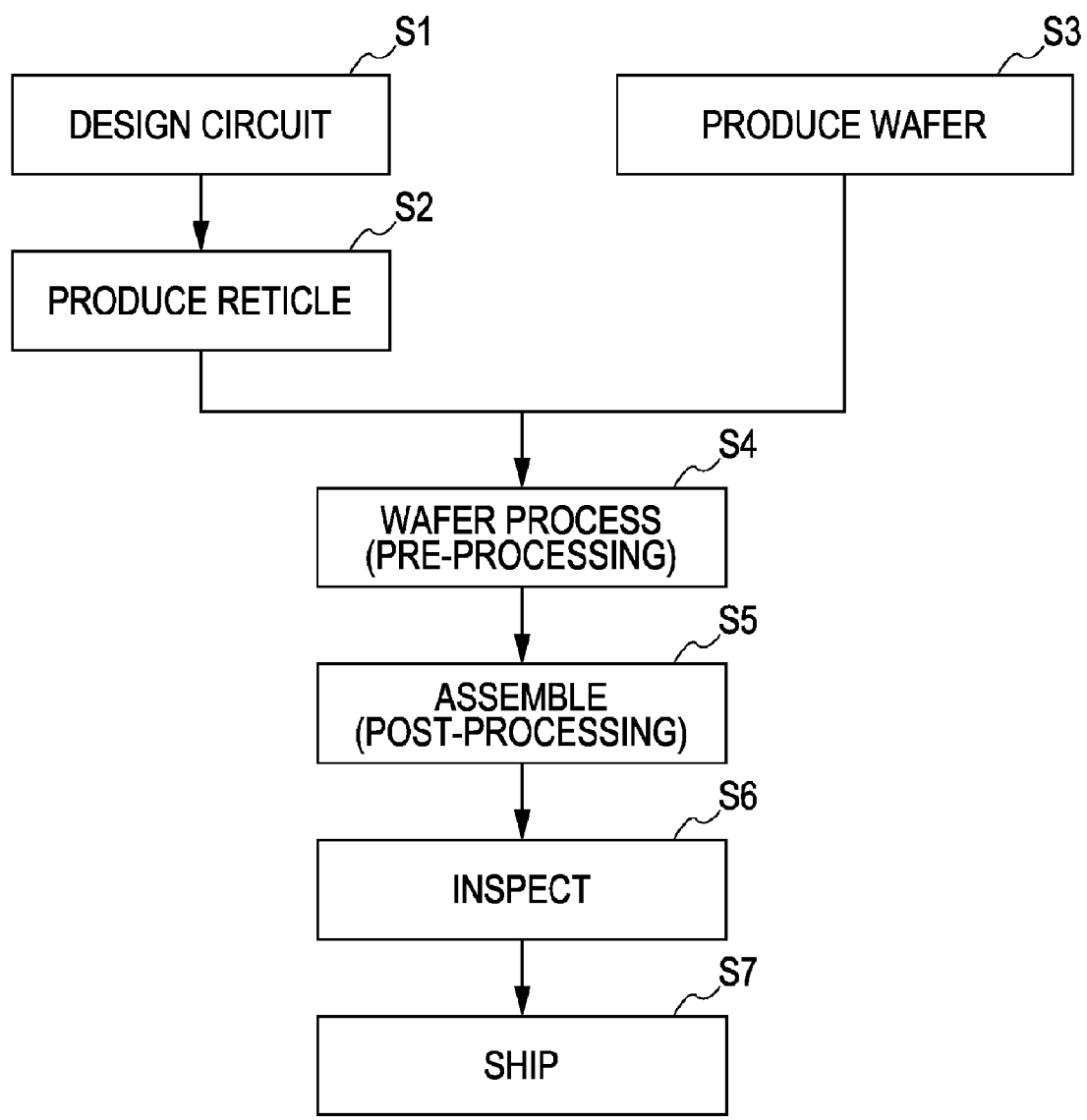

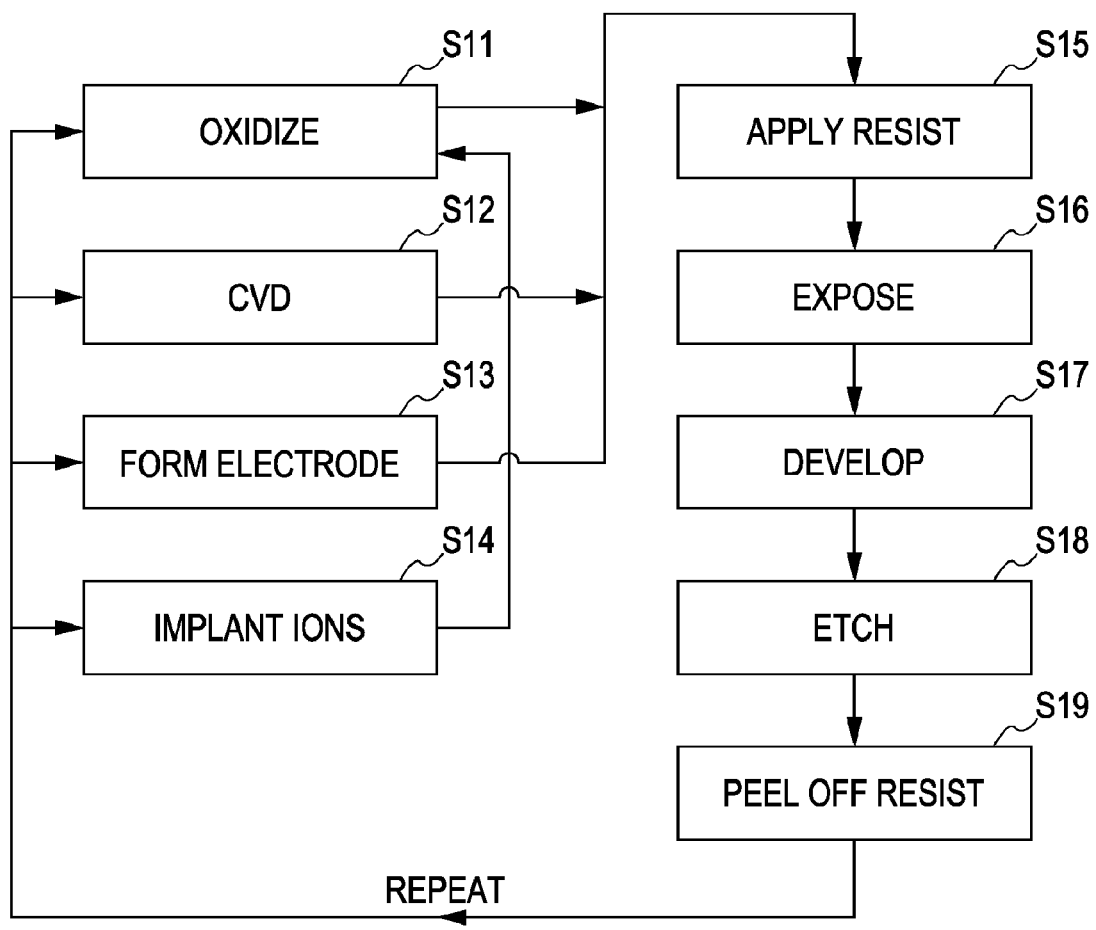

LIQUID-IMMERSION EXPOSURE METHOD AND LIQUID-IMMERSION EXPOSURE APPARATUS

BACKGROUND OF THE INVENTION

1. Field of the Invention

The present invention relates to a liquid-immersion exposure method and a liquid-immersion exposure apparatus, which are used for performing exposure of a substrate through a projection optical system and a liquid as a result of immersing a portion between a surface of the substrate and a final lens surface of the projection optical system into the liquid.

2. Description of the Related Art

Projection exposure apparatus which forms a circuit pattern on a reticle (mask) onto, for example, a substrate by exposure using a projection optical system is well known. In recent years, there is an increasing demand for an economical exposure apparatus having high resolution. In such a situation, liquid-immersion exposure is drawing attention as a method for meeting the demand for high resolution. In liquid-immersion exposure, the numerical aperture (NA) of the projection optical system is increased as a result of using a liquid for a medium at a substrate-side of the projection optical system. When the refractive index of the medium is n, the NA of the projection optical system is represented by $NA=n \cdot \sin \theta$. Therefore, when the medium has a refractive index that is higher than that of air (n>1), the NA can be increased to n. Accordingly, in liquid-immersion exposure, when the NA is increased, resolution R of the exposure apparatus, which is represented by $R=k1(\lambda/NA)$ (where k1 is a process constant and $\lambda$ is the wavelength of a light source), is consequentially made smaller (that is, the resolution is consequentially increased).

A local fill method has been proposed (described in PCT Domestic Re-Publication Patent Publication No. 99/49504). In the local fill method, a light-path space between a surface of a substrate and a final lens surface of a projection optical system is locally filled with a liquid in liquid-immersion exposure. However, since, in the local fill method, the liquid is circulated in the narrow gap between the surface of the substrate and the final lens surface of the projection optical system, the supply and recovery of the liquid may not be properly carried out. That is, the liquid is not properly supplied and recovered when a stage is moved. This may give rise to the following phenomena:(1) The liquid cannot be completely held below the final lens, causing it to fly to the surroundings. Therefore, the liquid remains on, for example, a measuring sensor, provided at the stage, or on the substrate; and (2) A film interface of the liquid becomes unstable, causing air bubbles to mix with the liquid.

Accordingly, in (1), when the liquid remains on the substrate, an exposure failure may occur due to process-related problems. On the other hand, when the liquid remains on the measuring sensor, exposure precision may be reduced due to an error in measurement. In (2), the characteristics of the projection optical system are impaired, thereby further reducing the exposure precision. This may result in exposure failure.

To overcome such problems, a method of confining the liquid by surrounding with gas the liquid between the surface of the substrate and the final lens surface of the projection optical system has been proposed (described in Japanese Unexamined Patent Application Publication No. 2004-289126). According to this method, the flying of the liquid to the surroundings, occurring when the liquid cannot be completely held between the surface of the substrate and the final lens of the projection optical system, can be minimized. However, regardless of where the structure discussed in Japanese Unexamined Patent Application Publication No. 2004-289126 is used, when the substrate is moved through a predetermined distance at a speed that is greater than or equal to a certain speed, the liquid flies to the surroundings from the space below the final lens. In addition, when the speed is further increased, the liquid remains on the substrate or the measuring sensor. That is, when the stage is moved at a speed that is greater than or equal to a certain speed, the liquid is left on the substrate or on the measuring sensor at the stage. A maximum movement speed of the stage at which the liquid does not remain in the surroundings as a result of flying from the space below the final lens is called "limit speed." The limit speed depends upon the distance of movement of the substrate, and is known to have a tendency to decrease as the movement distance is increased. Further, it is known that, during the movement, it depends upon the liquid repellency of a surface which the liquid contacts, and that the limit speed tends to decrease as the liquid repellency is decreased. That is, the limit speed is a parameter that is determined by the movement distance of the substrate and the liquid repellency of the moving surface.

In a liquid-immersion exposure apparatus, since priority is given to holding the liquid below the final lens, the speed of the stage needs to be kept less than or equal to the limit speed at all times during movement. Therefore, in particular, the movement times of the following movements, including first and second movements, become extremely long compared to those in a non-immersion exposure apparatus. The first movement corresponds to a movement immediately before exposure to a first exposure shot, that is, for example, movement to the first exposure shot after measurement of a positioning standard. The second movement corresponds to a movement immediately after exposure to a final exposure shot, that is, for example, movement for replacing a stage moving below the final lens. Movements for measuring various parameters are also included among the movements. These movements need to be performed through relatively long distances compared to those in the exposure operations. Since the movement times of these long-distance movements become long, the overall time required to process the substrate becomes long, that is, the throughput of the entire apparatus is reduced. Accordingly, in the liquid-immersion exposure apparatus, it is difficult to increase the throughput compared to that in the non-immersion exposure apparatus.

From another aspect, the following problem may arise. That is, a resist that is applied to the substrate tends to react chemically with a liquid, such as pure water. Therefore, depending upon the circumstances, a defect may occur in the resist at the stage of exposure and development. Consequently, an exposure process in which the resist on the substrate has a reduced amount of contact with the liquid is desired.

SUMMARY OF THE INVENTION

The present invention provides a liquid-immersion exposure apparatus which can reduce exposure failure and/or improve throughput as a result of addressing at least some of the aforementioned problems.

To this end, according to an aspect of the present invention, a liquid-immersion exposure method includes determining a stage movement path, on the basis of a liquid-repellency distribution at a substrate, which a liquid contacts, and at a surface of a member, provided around an outer periphery of the substrate; and moving the stage in accordance with the movement path.

According to another aspect of the present invention, a liquid-immersion exposure method includes determining a movement path of a stage on the basis of a limit speed of the stage that is determined in accordance with an area which a liquid contacts; and moving the stage in accordance with the movement path. Here, the movement path may be determined so that the movement time of the stage is as short as possible.

According to yet another aspect of the present invention, a liquid-immersion exposure includes forming an exposure layout of a substrate; providing possible movement paths of a stage having the substrate placed thereon, on the basis of the result of the layout forming step; calculating movement distances for when moving the stage in accordance with the possible movement paths; calculating liquid repellency distribution at a surface of a member, provided around the substrate, and at the substrate which the liquid contacts; determining a path having a relatively short stage movement time from the possible movement paths, on the basis of the results of the path providing step, the movement-distance calculating step, and the distribution calculating step; and moving the stage in accordance with the path determined.

According to still another aspect of the present invention, a liquid-immersion exposure method is performed in an immersion exposure apparatus where a stage moves with the liquid having been supplied at the time of non-exposure. The immersion exposure method includes withdrawing the center of gravity of an area that contacts the liquid from within the substrate to outside the substrate, and moving the stage around the substrate so that the center of gravity of the area that contacts the liquid does not pass within the substrate.

According to another aspect of the present invention, a liquid-immersion exposure method is performed in a liquid-immersion exposure apparatus where a stage is moved with a liquid having been supplied during non-exposure, to transfer the liquid from the stage to another member. The method includes determining a movement path of the stage so that the area of a locus of the liquid passing within a substrate when the liquid moves from a final exposure shot area of the substrate to a liquid transfer portion outside the substrate is smaller than the area of a locus of the liquid passing within the substrate when the liquid passes a straight line connecting the final exposure shot area and the liquid transfer portion.

According to yet another aspect of the present invention, a liquid-immersion exposure method is performed in a liquid-immersion exposure apparatus including a member provided on a stage so as to surround an outer periphery of a substrate, the stage being moved with a liquid having been supplied during non-exposure in the liquid-immersion exposure apparatus. The method includes moving the stage so that, when an area which the liquid contacts is provided on both sides of the outer periphery of the substrate, the area passes along a path extending in a light-shielding direction of a light-shielding member from the center of the substrate.

According to the liquid-immersion exposure apparatus of the present invention, throughput is increased and exposure failure is reduced.

Further features of the present invention will become apparent from the following description of exemplary embodiments with reference to the attached drawings.

BRIEF DESCRIPTION OF THE DRAWINGS

FIG. 7 shows an exemplary stage movement path.

FIG. 8 shows another exemplary stage movement path.

FIG. 16 is a flowchart for illustrating a method of manufacturing a device (such as a semiconductor chip, including an IC or an LSI, an LCD, or a CCD sensor).

FIG. 17 is a flowchart illustrating in detail a wafer process of Step S4 shown in FIG. 16.

DESCRIPTION OF THE EMBODIMENTS

Figure 1:
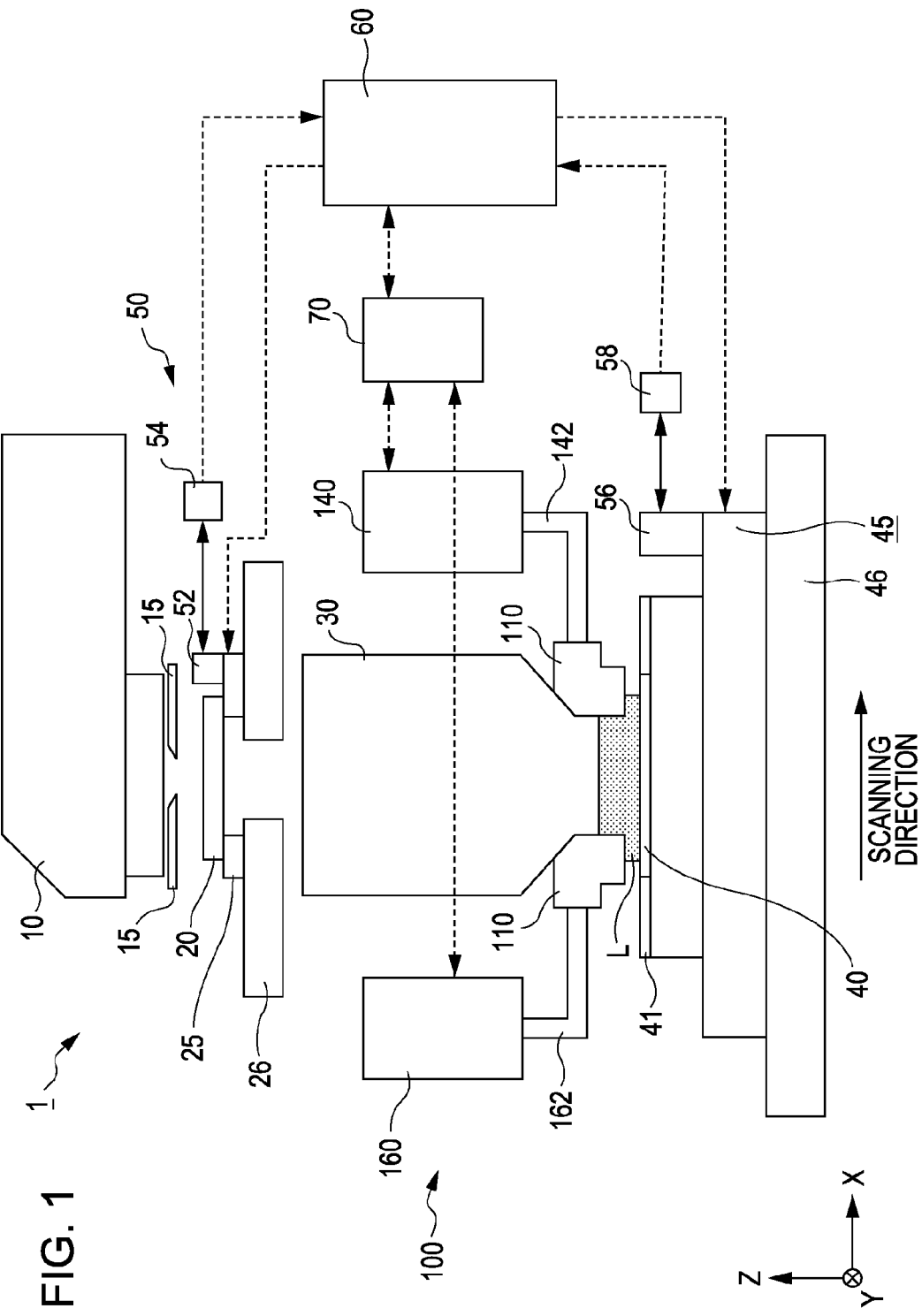
FIG. 1 illustrates an example liquid-immersion exposure apparatus.

Various embodiments of the present invention will now be described with reference to the attached drawings.

First Embodiment

An exposure apparatus according to a first embodiment will hereunder be described with reference to the attached drawings. Parts provided with the same reference numeral but different alphabetical characters will be generalized using the same reference numeral without the alphabetical characters.

FIG. 1 is a schematic sectional view of an exemplary structure of a liquid-immersion exposure apparatus 1 according to the first embodiment. The liquid-immersion exposure apparatus 1 is an immersion-type projection exposure apparatus that transfers a circuit pattern, formed on a reticle 20, onto a substrate 40 by exposure through a liquid L supplied between the substrate 40 and a final lens (final optical element), disposed at a substrate-40 side of the projection optical system 30. The exposure method may be either a step-and-repeat method or a step-and-scan method.

As shown in FIG. 1, the liquid-immersion exposure apparatus 1 includes an illuminating device 10, a masking blade 15, a reticle stage 25, on which the reticle 20 is placed, and the projection optical system 30. In addition, the liquid-immersion exposure apparatus 1 includes an auxiliary plate (hereunder referred to as a coplanar plate) 41 and a moveable wafer stage 45, on which the substrate 40 and the auxiliary plate 41 are placed. The auxiliary plate 41 is provided so as to surround the outer periphery of the substrate 40, is provided with the substrate 40, and has a surface at substantially the same height as that of the substrate 40. The wafer stage 45 can move along a surface of a base 46. Further, the liquid-immersion exposure apparatus 1 includes a measuring unit 50 (measuring units 52, 54, 56, and 58), which measures the position of the stage, a stage controlling unit 60, a liquid-immersion controlling unit 70, and a liquid supply/recovery device 100 (liquid supply/recovery devices 110, 140, 142, 160, and 162). Although, in FIG. 1, the coplanar plate 41 is shown as a structure provided separately from the wafer stage 45, it may as an alternative be integrally formed with the wafer stage 45.

On the basis of an output of the measuring unit 50, including the interferometers 54 and 58 and reflecting mirrors 52, and 56, the stage controlling unit 60 controls the driving of the reticle stage 25 and the wafer stage 45. The liquid-immersion controlling unit 70 obtains information, such as current position, speed, acceleration, target position, and movement direction of the wafer stage 45, from the stage controlling unit 60. Then, it performs a controlling operation related to liquid-immersion exposure, on the basis of these items of information. For example, the liquid-immersion controlling unit 70 applies to the liquid supply device 140 and the liquid recovery device 160 of the liquid supply/recovery device 100, a control command for controlling, for example, switching between the supply and recovery of the liquid L, the stopping of the supply and recovery of the liquid L, and the amount of liquid L that is supplied and recovered. Then, at a nozzle 110, the liquid L is supplied and/or recovered, to hold a liquid film below a final lens.

Figure 2:
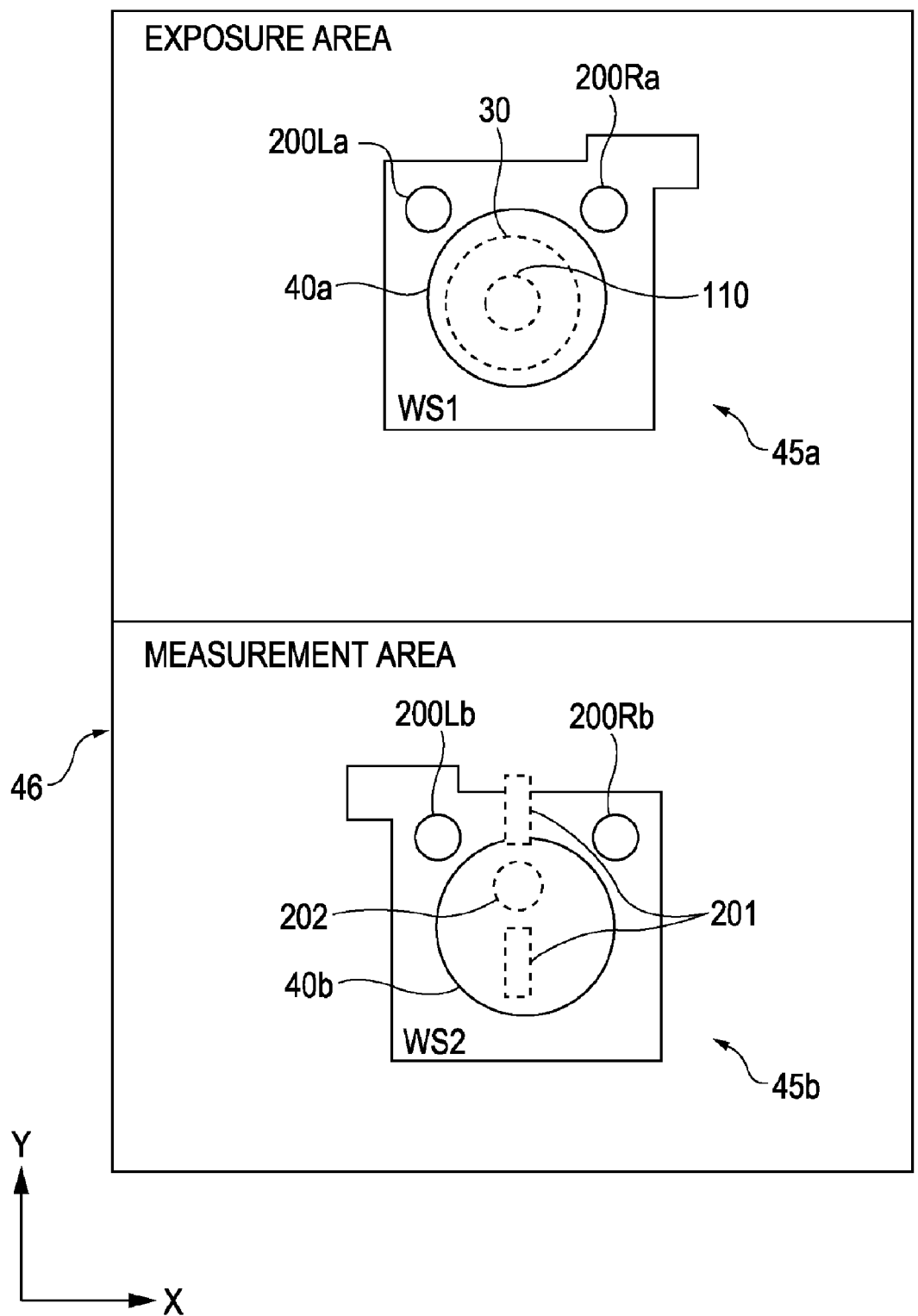
FIG. 2 is a schematic view of wafer stages in the exposure apparatus which can perform parallel processing at two wafer stages.
Figure 3:
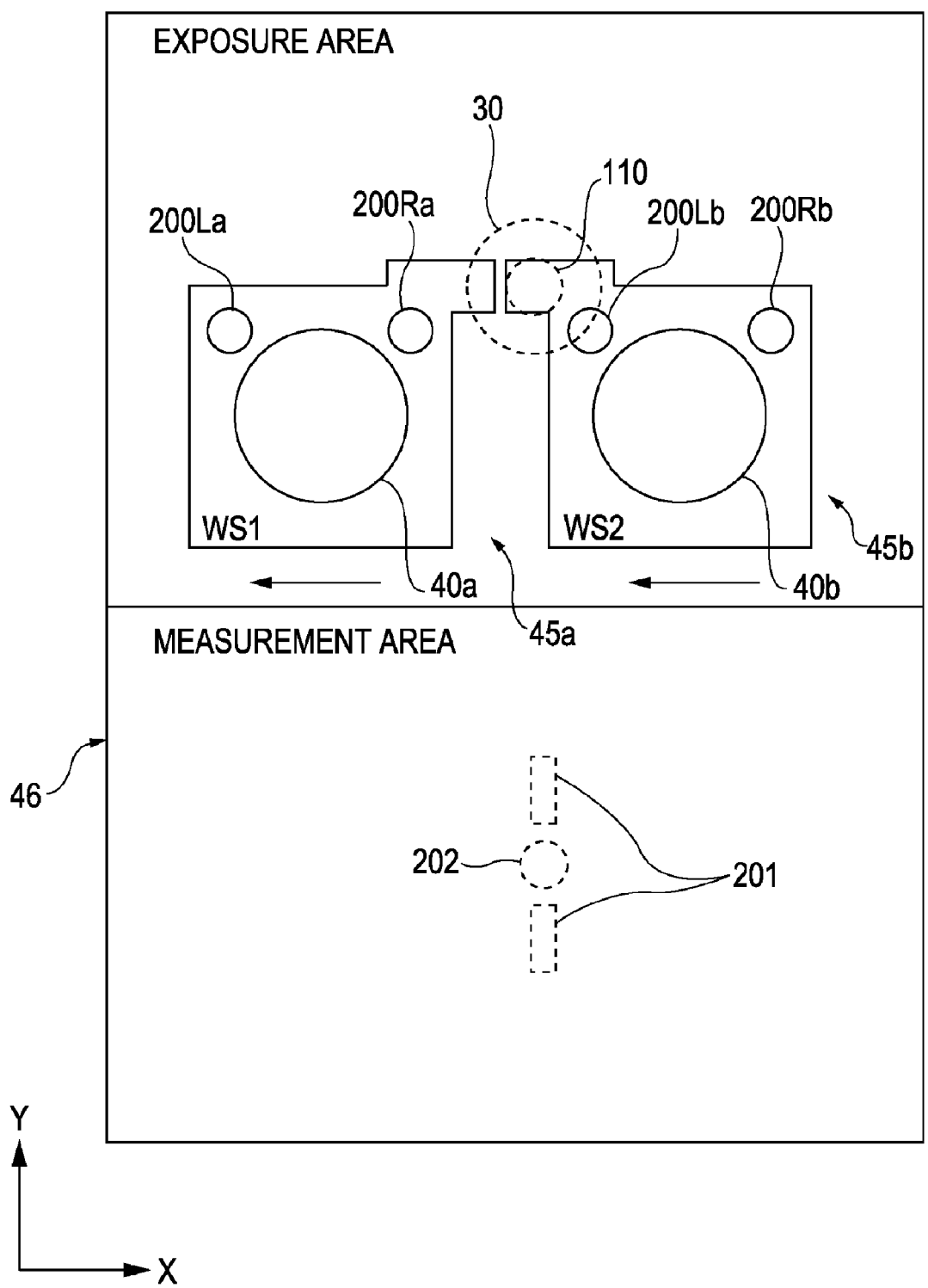
FIG. 3 shows a replacement sequence of the wafer stages in the exposure apparatus which can perform parallel processing at two wafer stages.

Next, the movements of wafer stages when the wafer stage that moves below the final lens of the projection optical system 30 is replaced will be described using FIGS. 2 and 3. FIGS. 2 and 3 illustrate the movements of two wafer stages WS1 and WS2 of the exposure apparatus including the wafer stages WS1 and WS2 and capable of performing a parallel operation at a measurement area and an exposure area.

In the measurement area, measurement of the positional relationship between a wafer stage 45*b* and a wafer 40*b* using an alignment scope 202, measurement of the form of a surface of the wafer 40*b* using a focus scope 201, and measurement of a focusing operation in a light-axis direction are carried out. In the exposure area, after measuring the positional relationship between a wafer 40*a* and the reticle 20, a reticle pattern is transferred onto each shot (i.e. die or other exposure site) of the wafer 40*a* by sequential exposure.

In FIG. 2, at the exposure area, a stage 45*a* (WS1) performs positioning of the wafer 40*a*, and, concurrently, at the measurement area, the stage 45*b* (WS2) performs positioning of the wafer 40*b*. When the wafer operations are completed, as shown in FIG. 3, the stage WS1 is moved to a position that is adjacent to the stage WS2. Here, the stages WS1 and WS2 are moved while they are kept apart by a very small gap of approximately 0.1 to 1 mm, so that the stage WS1 that moves below the final lens is replaced by the stage WS2. A liquid-repellency treatment is performed near a portion where the stage WS1 and the stage WS2 are adjacent to each other (that is, a transfer portion where liquid is transferred from the stage WS1 to the stage WS2), to prevent immersion liquid from entering the very small gap between the stages. Accordingly, the stage WS1 is replaced by the stage WS2 while the immersion liquid is held below the final lens. Although, in the embodiment, the exposure apparatus in which parallel processing can be performed on the two wafer stages at the measurement area and the exposure area is used as an example, the present invention is applicable to an exposure apparatus that does not perform parallel processing, so that the present invention is not limited to the exposure apparatus having the above-described structure.

Figure 4:
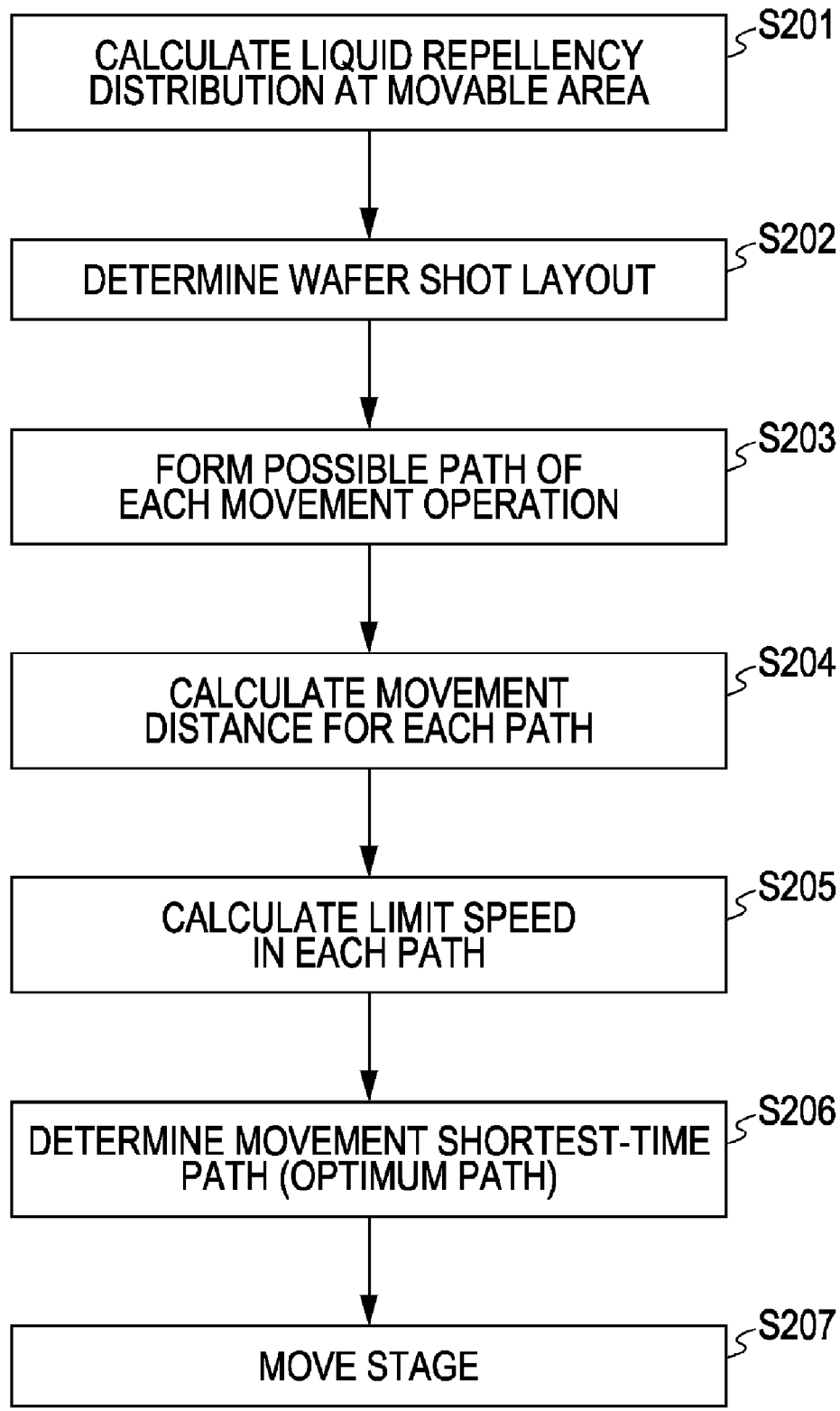
FIG. 4 is a flowchart of steps up to a stage movement step in a first embodiment.

Next, a method of moving a stage on the basis of the present invention will hereunder be described with reference to FIGS. 4 to 8. FIG. 4 shows an exemplary flowchart of steps up to a stage movement step on the basis of the present invention. The steps will be described in accordance with the flowchart of FIG. 4.

Figure 5:
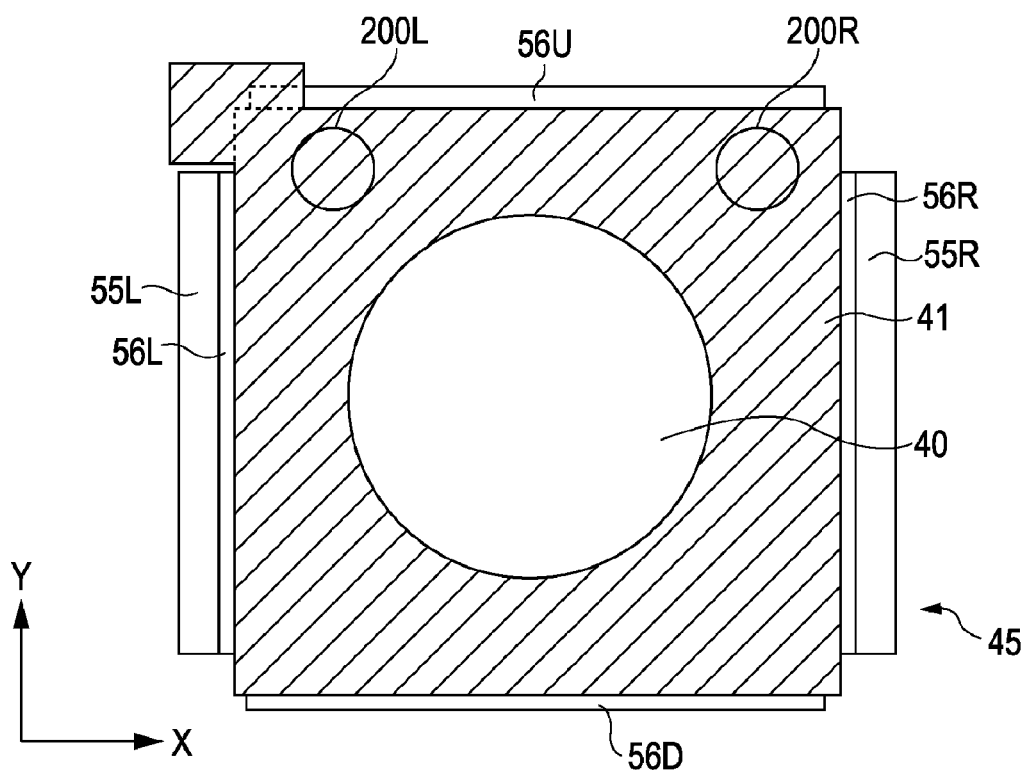
FIG. 5 shows liquid repellency distribution in the first embodiment.

First, in Step S201, the liquid repellency distribution of an area which a liquid may contact (hereafter referred to as "liquid contact area") is calculated. An example of the liquid repellency distribution that is calculated in Step S201 is shown in FIG. 5. (The reflecting mirror 56 shown in FIG. 1 is shown as reflecting mirrors 56R, 56L, 56D, and 56U in FIG. 5. In addition to the reflecting mirror 56, reflecting mirrors 55R, 55L, 55U, and 55D are provided in FIG. 5.) In FIG. 5, the liquid contact area corresponds to a top portion of the coplanar plate 41, represented by cross-hatching, and the wafer 40, represented in a hollow form. Ordinarily, to hold a liquid film, a liquid repellency treatment is performed on the coplanar plate 41, so that the liquid repellency is maintained at a high state. The wafer 40 may have various liquid repellencies depending upon the process. However, in general, its liquid repellency is at an intermediate level that is smaller than that of the coplanar plate 41. That is, in FIG. 5, the liquid repellency distribution is shown as being formed by a high liquid-repellency area (area of the coplanar plate 41) and an intermediate liquid-repellency area (area of the wafer 40).

Next, in Step S202, a layout of shots, which are units for performing exposure on the wafer (substrate), is determined. The layout is determined considering, for example, the size of the circuit pattern that is transferred by exposure, or the number of shots on one wafer. In addition, in Step S202, in what order the exposure is performed from which shot (die or other exposure site), and at which shot the exposure is finally completed are determined.

Then, in Step S203, an arbitrary number of possible movement paths of respective movements is formed. In particular, compared to the movement between each shot, the movement immediately before exposure of the first shot and the movement immediately after exposure of the final shot are performed over a longer movement distance, and through a larger degree of freedom in terms of movement paths. Therefore, the probability of the number of possible movement paths being more than one is high. Consequently, the possible movement paths include, not only those provided by, for example, a designer, but also those provided by a certain calculation algorithm.

Next, in Step S204, the movement distances corresponding to the respective possible movement paths are calculated.

Next, in step S205, the movement distance, and the maximum stage movement speed for each path, that is, the limit speeds, are calculated. A method of calculating the limit speeds at which the immersion liquid does not remain in the surroundings as a result of flying from the space below the final lens is described below considering the liquid repellency at movement path planes. It is known that the limit speed changes with the movement distance and the liquid repellency at the movement path plane, and conceptually exhibits the relationship such as that shown in FIG. 6. Roughly stated, when the movement distance is increased, the limit speed is reduced; and, when the liquid repellency is increased, the limit speed tends to be large. On the basis of the relationships shown in FIG. 6, the limit speeds are calculated from the movement distances of the respective possible movement paths and the liquid repellencies along the paths.

Further, from the movement distances of the respective possible movement paths and the limit speeds, the movement times of the respective possible paths can be calculated, so that these are compared to determine the path through which movement can be performed in the shortest time (Step S206).

Then, the stage is moved in Step S207 along the movement path determined in Steps S201 to S206 to take the shortest time.

Figure 10:
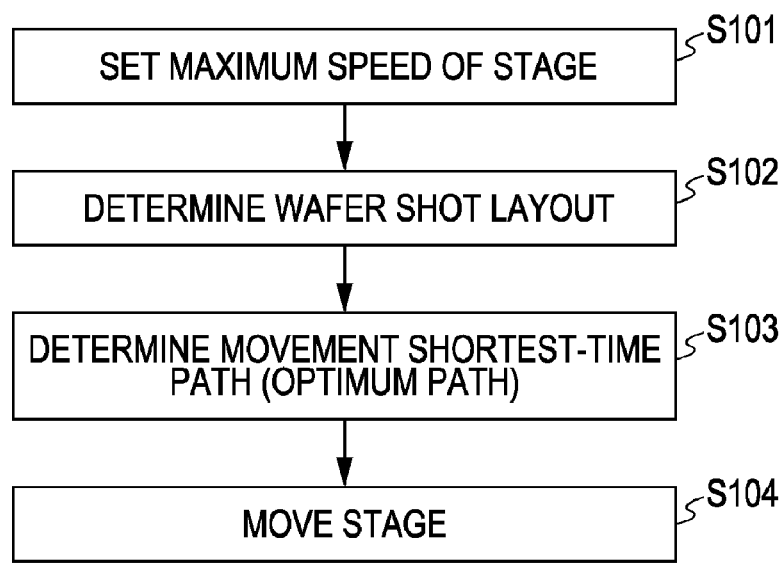
FIG. 10 is a flowchart of steps up to a stage movement step in accordance with a related art.

The exemplary flowchart of the steps up to the stage movement step according to the present invention has been described. To clarify the difference between the case in which the present invention is carried out and the case in which the present invention is not carried out, a flowchart of steps up to a stage movement step when the present invention is not carried out is illustrated in FIG. 10. First, in Step S101, the maximum speeds of the stage are set. Ordinarily, the maximum speeds in the X direction and the Y direction are set. Then, in Step S102, a layout of wafer shots is determined. Thereafter, in Step S103, a shortest-time path is calculated from the maximum speeds in the X and Y directions, and from a movement starting point and a movement end point, which are determined from the shot layout. Thereafter, in Step S104, the stage is moved in this path.

An exemplary shortest-time movement path, which is calculated in the flowchart in FIG. 10, is one formed by connecting the movement starting point and the movement end point by a straight line. Another example is one formed by a section in which the stage moves at a maximum speed in both the X-axis direction and the Y-axis direction, and by a section in which the stage moves at a maximum speed in either the X-axis direction or the Y-axis direction and in which the stage stops in the other of the X-axis direction and the Y-axis direction. For example, when the maximum speeds in the X-axis direction and the Y-axis direction are the same, the locus of a liquid-immersion area is one formed by a combination of a movement locus extending in a direction that is ±45 degrees or ±135 degrees from the X-axis direction, and the movement path in the X-axis direction or the Y-axis direction.

Exemplary movement loci, which are determined by the steps of the flowchart, are indicated by S11 and S12 in FIG. 7, and by S13 and S15 in FIG. 8.

In the flowchart in FIG. 10, it is assumed that a change in the setting of the speed of the movable stage, occurring depending upon the movement path and an area which a liquid contacts, does not occur. Therefore, when the movement starting point and the movement end point are determined, it is possible to easily calculate back a shortest-time path without providing possible paths. In contrast, in the flowchart in FIG. 4, the condition that, depending upon the liquid repellency distribution, the speed of the movable stage changes considerably depending upon the movement path is added, so that an optimum movement path is selected from possible movement paths, instead of back calculating the shortest-time movement path.

Here, the "maximum speed of the stage" primarily refers to the maximum speed that the stage can reach by itself, and differs in meaning from the above-described term "limit speed." In addition, the maximum speed of the stage is primarily a parameter determined by a driving system, and at least does not change due to the liquid repellency and the movement distance.

Movement paths will hereunder be described in more detail using specific movement paths as examples with reference to FIGS. 7 and 8. Here, solid-line arrows and a broken-line arrow, shown in FIGS. 7 and 8, indicate approximate loci that are formed when the center of a light axis in the final lens of the projection optical system 30 is projected onto the stage (that is, the coplanar plate 40 and substrate 41). The loci also correspond to areas where a liquid contacts the substrate and the coplanar plate, respectively.

After replacing the stage moving below the final lens as in FIG. 3, an area where liquid is held (hereunder referred to as "liquid immersion area") forms a path on the stage as shown in FIG. 7. That is, the solid-line arrows in FIG. 7 represent the movement locus at substantially the center of the liquid-immersion nozzle 110, shown in FIGS. 1 to 3. FIG. 7 shows the movement locus formed by movements that are performed for measuring a wafer-positioning reference. When replacing the stage, the liquid-immersion area is moved to a reference mark 200L from an area of the coplanar plate that the liquid-immersion area passes (that is, an upper left projection in FIG. 7, and hereunder referred to as "liquid-immersion transfer area), to perform a measurement (S21). Then, the liquid-immersion area is moved to another reference mark 200R, to perform a measurement (S22), so that the positioning reference is measured. Thereafter, the liquid-immersion area is moved to a first shot (e.g. die) on the wafer (S23) as shown in FIG. 8. Then, the movement is performed between shots in the exposure order determined by each shot (S24, not shown).

After completing the exposure of the final shot, since a stage replacement operation is to be performed as shown in FIG. 3, the liquid-immersion area moves to the liquid-immersion transfer area. The movement path will hereunder be described in detail.

When the movement path is determined on the basis of the flowchart in FIG. 10, the movement path is defined by S15 in FIG. 8. In contrast, when the movement path is determined on the basis of the flowchart of FIG. 4 according to the present invention, the movement path is defined by, for example, S25 in FIG. 8. First, in Step S201, the layout of the wafer is determined. Then, in Step S202, possible movement paths are provided. The possible movement paths include, for example, the path S15 (or first possible path) and the path S25 (or second possible path), provided around the wafer. The movement distance of each of the paths S15 and S25 is also calculated. For example, the movement distance of the path S15 is 350 mm, and the movement distance of the path S25 is 450 mm. At the same time, the liquid repellencies at the wafer 40 and the coplanar plate 41 are previously set to calculate the liquid repellency distribution of the liquid contact area shown in FIG. 5 (S204). In this example, it is assumed that the liquid repellency at the wafer 40 is at an intermediate level, and that at the coplanar plate 41 is at a high level. Thereafter, from the movement distances of the paths S15 and S25 and the liquid repellencies at the paths, the movable limit speeds are calculated on the basis of the relationship shown in FIG. 6. For example, since the path S15 extends through a large portion of the wafer 40, the liquid repellency is at an intermediate level, so that, when the movement distance is 350 mm, the limit speed is approximately 200 mm/s. In contrast, since the whole path S25 extends through the coplanar plate 41, the liquid repellency is at a high level, so that, for example, even when the movement distance is 450 mm, the limit speed is approximately 450 mm/s. Next, in S206, a path which can be passed through in a shorter time is selected from the relationship between the limit speeds and the movement distances of the respective paths S15 and S25. More specifically, whereas the movement time in the path S15 is 1.75 s, the movement time in the path S25 is only 1 s. Therefore, the movement time in the path S25 can be considerably shorter than that in the path S15.

Although, in the foregoing description, the first possible path S15 and the second possible path S25 are formed, and either one of the paths S15 and S25 is selected, the number of possible paths that are formed may be greater than two.

In addition, on the basis of the liquid repellency distribution or the limit speeds, movement paths may be determined so that the movement times are less than the movement time when the stage moves at the limit speed along the straight line connecting the movement starting point and the movement end point. In this case, a plurality of possible paths need not be formed.

Figure 6:
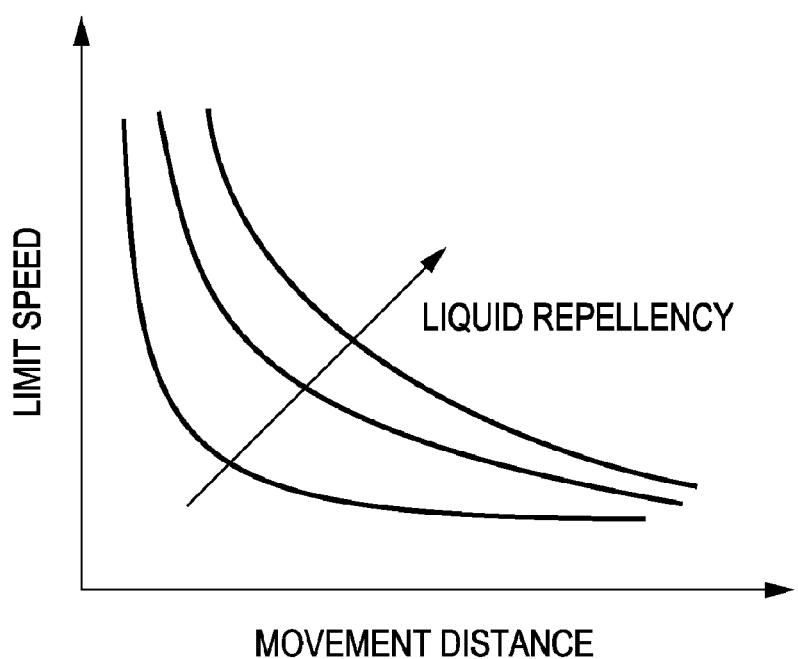
FIG. 6 shows a graph schematically showing the relationship between movement distance, liquid repellency, and limit speed.
Figure 9:
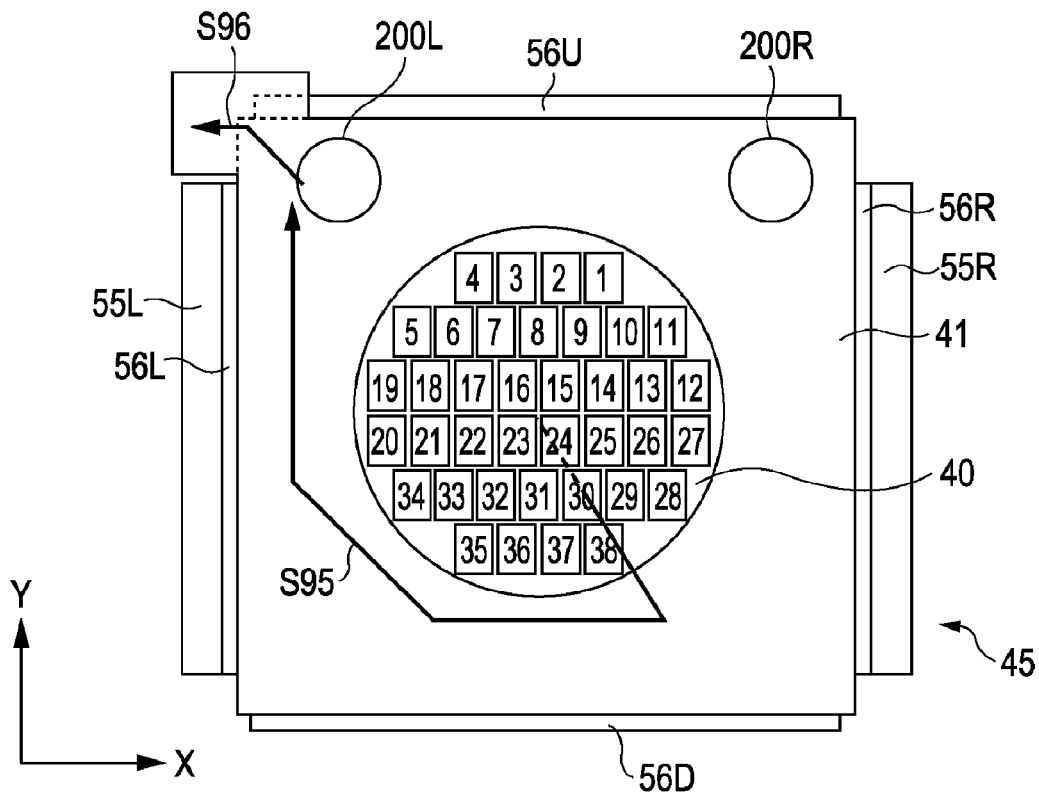
FIG. 9 shows still another exemplary stage movement path.

In this example, it is determined that the movement can be performed in a short time in the path S25. However, depending upon the condition, there is not much difference between the limit speeds considering the difference between the movement distances of the paths. Accordingly, the movement time of the longer path S25 becomes correspondingly longer, as a result of which it may be determined that the path S15 is the optimal path. However, according to the foregoing discussion, when the liquid repellency at the surface of the wafer is smaller than that at the surface of the coplanar plate, the path extending around the wafer (such as the path S25) is almost always determined as the path through which movement can be performed in a shorter time. As described above, compared to a path crossing the wafer 40 as with a related path, the movement time in the path extending around the wafer 40 is reduced depending upon the condition, such as the liquid repellency. In addition, the present invention provides other advantages. Resist that is applied to the wafer 40 tends to react chemically with the immersion liquid, such as pure water. Therefore, depending upon the circumstances, a defect may occur in the resist at the stage of exposure and development. Consequently, an exposure process in which contact of the resist on the wafer 40 with the liquid is minimized is desired. For this reason, from the viewpoint that the path extending around the wafer 40 reduces exposure failure, it can be said that this path is an optimal path. Here, it is possible to give priority to reducing the exposure failure. That is, as an example, it is possible to provide a path in which the integral of the area at which the liquid L contacts the surface of the wafer 40 is minimized. The integral of the area refers to a value resulting from integrating the area that the liquid L contacts over time. In addition, it is possible to provide a path in which, for each area (exposure shot) on the surface of the wafer 40, the uniformity of integral areas that the liquid L contacts is maximized. That is, a related path may be one that is formed on both sides of the wafer 40 immediately after exposure. Such a related path gives rise to problems, such as an increase in the integral area that the liquid L contacts for each shot, and the occurrence of distribution non-uniformity. FIG. 9 shows a movement locus of the center of gravity of the liquid-immersion area immediately after exposure of the final shot (shot number 39). The movement locus corresponds to one that gives priority to reducing exposure failure. The dotted line in FIG. 9 is used to illustrate that, when the center of gravity of the liquid-immersion area is moved within the coplanar plate 41 from the wafer 40, the locus of the liquid-immersion area extends along a line extending radially from the center of the wafer. That is, when the horizontal cross-section of the liquid-immersion area is circular, a path S95 in which the integral area that the liquid L geometrically contacts is a minimum is shown in FIG. 9. Accordingly, compared to the related path S15 immediately after exposure, it is possible to reduce the integral area in which the liquid L contacts the surface of the wafer 40, and to reduce non-uniformity in the distribution of the integral areas of the respective areas of the wafer 40, so that exposure failure can be reduced. Here, in FIG. 9, the locus of the liquid-immersion area is moved along a line extending radially from the center of the wafer 40, on the assumption that the horizontal cross-section of the liquid-immersion area is circular. When the horizontal cross-section of the liquid-immersion area is not circular, the movement path shown in FIG. 9 is not necessarily optimum. In this case, the movement path can be determined considering the size of the integral area in which the liquid-immersion area contacts the wafer or the distribution between each area (each exposure shot). Although, in the foregoing description, the integral area is considered, it is possible to consider an area of a locus of the liquid-immersion area extending within the substrate when the liquid-immersion area moves from the final shot area of the substrate to the transfer portion. The movement path of the stage may be determined so that the area of this locus is smaller than the area of a locus of the liquid that passes within the substrate when the liquid-immersion area passes the straight line connecting the final shot area and the transfer portion. Although FIG. 8 illustrates the case in which the stage is moved through a route where the liquid-immersion area extends around the wafer 40, the present invention is not limited to the case in which the entire liquid-immersion area is not provided within the wafer 40. That is, even if a portion of the liquid-immersion area is provided within the wafer 40, as long as a large portion of the liquid-immersion area is in contact with the coplanar plate 41, the relationship in FIG. 6 is established to a certain degree. Therefore, the limit speed tends to increase as expected. According to the results of the discussion up until this point, as long as at least half of the area of the liquid-immersion area is in contact with the surface of the coplanar plate, the limit speed is obviously higher than that when the liquid-immersion area contacts only the surface of the wafer 40.

Although, as a matter of convenience for discussion, the movement limit speed in the entire path is described as being the same, the path may be divided into several areas, so that movement is performed with, for example, the speed of movement being increased in a certain divided area and the speed of movement being reduced in a different divided area. If cases in which the relationship shown in FIG. 6 where the speed during the movement is varied are known, a better path can be calculated. That is, here, the path to be calculated, which is obviously defined by the optimum movement locus, is defined by a speed profile during the optimum movement.

The flowchart of calculating the path according to the present invention is discussed using FIG. 6. The flowchart may be incorporated on-line in a portion of or the entire interior of the exposure apparatus. In addition, at least some of the steps of the flowchart may be calculated on-line to reflect these calculations in the movement of the stage. For example, as mentioned above, when the liquid repellency at the surface of the wafer is smaller than that at the surface of the coplanar plate, the path immediately after exposure of the final shot may be set so that it always extends through the path S25 extending around the wafer.

Here, on the basis of the flowchart shown in FIG. 10, a path like the path S25 cannot be taken. On the other hand, on the basis of the flowcharts according to the present invention, it is possible to realize for the first time that a path like the path S25 can be taken. That is, when the movement path is determined on the basis of the liquid repellency distribution so that the movement time of the stage is shorter than the movement time when the stage moves along a straight line connecting the movement starting point and the movement end point, the throughput can be generally increased.

As described above, in the present embodiment, the path of movement of the stage is determined on the basis of the liquid repellency distribution at the surface of a member, provided so as to surround the outer periphery of the substrate, and the substrate that a liquid contacts. Then, the stage is moved in accordance with the movement path. By this method, it is possible to increase the throughput of the exposure apparatus.

It is possible to determine a movement path of the stage without determining the liquid repellency distribution. That is, it is possible to directly determine the limit speed that is determined in accordance with the area that a liquid contacts, to determine the movement path of the stage in accordance with the limit speed, so that the stage is moved in accordance with this movement path.

Further, in the present embodiment, the center of gravity of the area that the liquid contacts withdraws to the outside of the substrate from within the substrate, and, then, is moved so as not to pass within the substrate. This makes it possible to reduce exposure failure and improve yield.

Second Embodiment

A second embodiment will now be described with reference to FIGS. 11 to 14. First, it will be described with reference to a specific example using FIG. 12.

Figure 12:
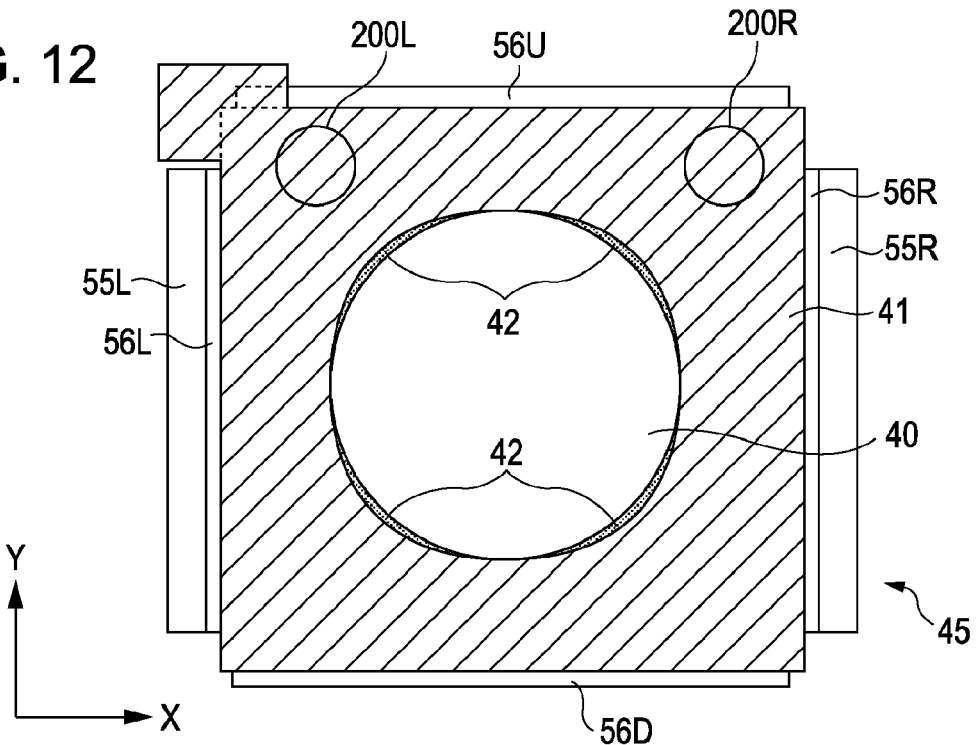
FIG. 12 shows liquid repellency distribution in the second embodiment.

FIG. 12 illustrates an exemplary liquid repellency distribution that is different from that shown in FIG. 5 showing the area where the liquid-immersion area is movable. FIG. 5 illustrates the distribution including two types of liquid repellencies, that is, the liquid repellency at the coplanar plate 41 and that at the wafer 40. In contrast, FIG. 12 illustrates the distribution including three types of liquid repellencies, that is, the liquid repellency at a coplanar plate 41, that at a wafer 40, and that at a hydrophilic area 42. The hydrophilic area 42 is provided on the coplanar plate 41, is situated adjacent to the outer periphery of the wafer 40, and has a very low liquid repellency. Even if a liquid-repellency treatment is previously performed on this area, the hydrophilic area 42 is irradiated with exposure light, thereby resulting in a hydrophilized state (that is, a reduction in liquid repellency).

This is because of the characteristics of the masking blade 15 (illustrated in FIG. 1). Accordingly, the hydrophilized state results from leakage of exposure light irradiation. That is, the masking blade 15 serves as a light-shielding plate for preventing an area other than a shot that is to be exposed from being irradiated with exposure light, and is set in synchronism with an exposure operation, to move the light-shielding plate for making adjustments. The ordinary masking blade 15 comprises the light-shielding plate that can shield light in the X-axis direction and the Y-axis direction in FIG. 12, whereas the wafer 40 is circular. Therefore, an exposure-light leakage area corresponding to the hydrophilic area 42 cannot be eliminated. To reduce the exposure-light leakage, an additional masking blade that can shield light at an angle of 45 degrees from the X axis and the Y axis can be provided. However, the structure of the masking blades becomes very complicated. In addition, for example, reliability is reduced, and costs are increased.

Figure 13:
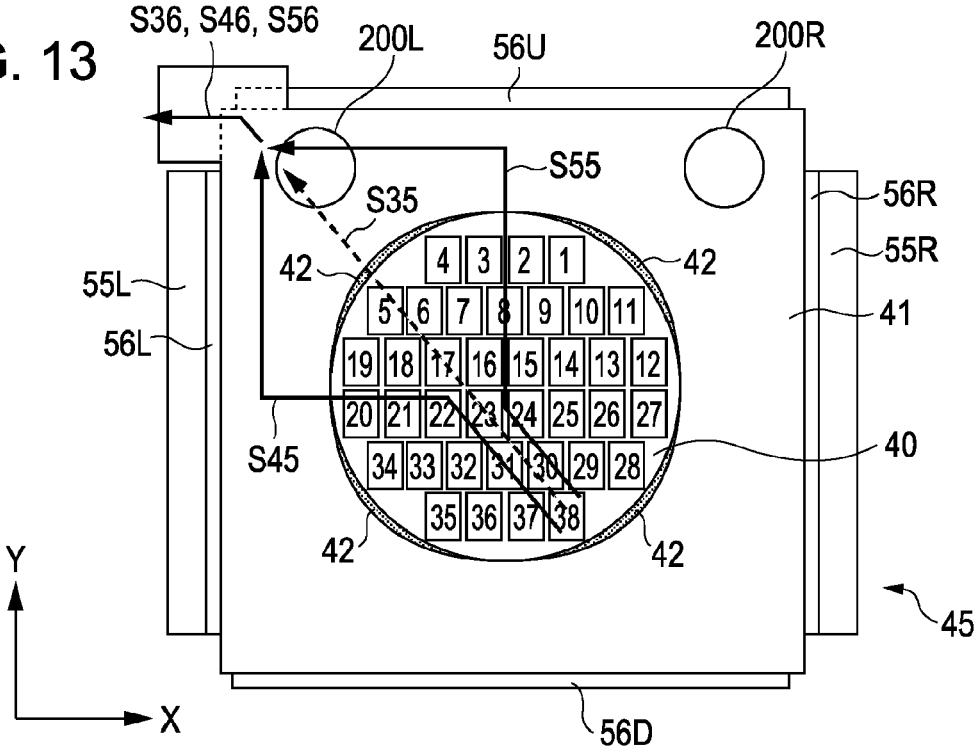
FIG. 13 shows an exemplary stage movement path.
Figure 14:
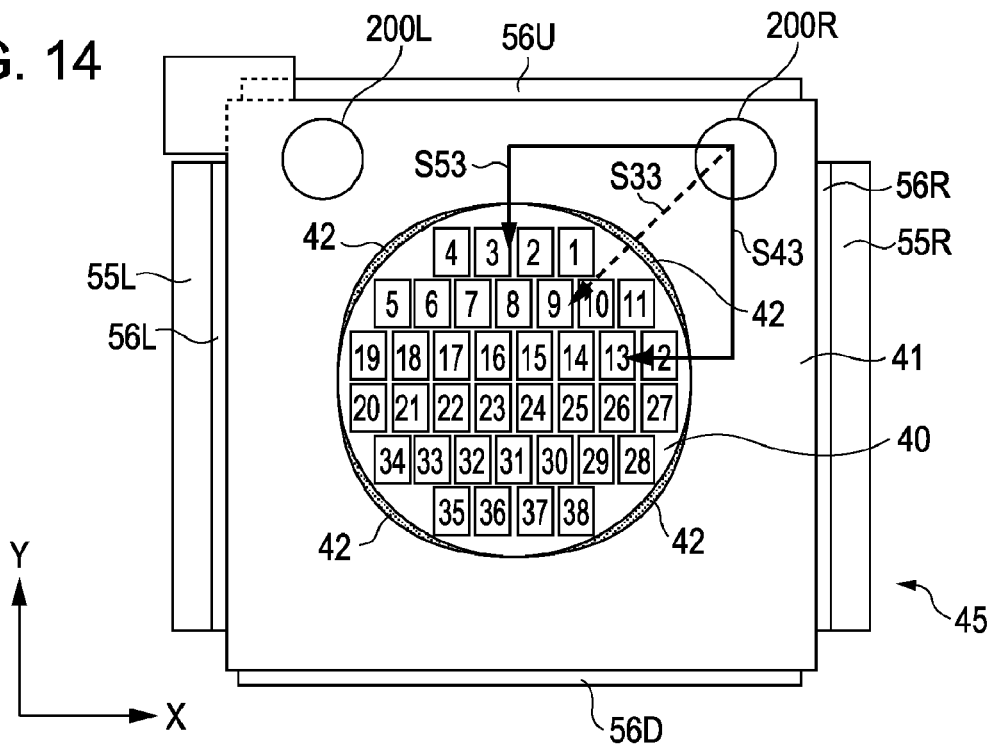
FIG. 14 shows another exemplary stage movement path.

Here, it can be seen from FIG. 12 that, from the characteristics of the masking blade 15, the hydrophilic area 42 in an area near a path extending in the light-shielding direction (here, the X-axis direction or the Y-axis direction) of the masking blade 15 from the center of the wafer 40 is relatively small. Therefore, in forming the liquid-immersion area on both sides of the outer peripheral portion of the wafer 40, when the liquid-immersion area is moved along the path extending in the light-shielding direction of the masking blade 15 from the center of the wafer 40, the influence of the hydrophilic area 42 can be reduced. That is, if such a movement is performed, the problem that the limit speed in FIG. 6 is reduced to a very low value due to a low liquid repellency of the hydrophilic area 42 can be eliminated. Here, "light-shielding direction" refers to a direction in which exposure light is shielded as the masking blade moves, and is differentiated from the direction of movement of the masking blade. FIG. 13 shows an exemplary path when movement is performed from the inner portion of the wafer 40 to the coplanar plate 41 on the basis of these viewpoints. An example of a path of the liquid-immersion area based on the related flowchart of FIG. 10 is path S35. Paths in which the characteristics of the hydrophilic area 42 are considered as mentioned above are paths S45 and S55. FIG. 14 shows an exemplary path when movement is performed from the reference mark 200R on the coplanar plate 41 to the inner portion of the wafer 40, as mentioned above. S33 denotes a path based on the related flowchart of FIG. 10, and S43 and S53 denote paths based on the present invention. As long as a path is based on the related flowchart such as that shown in FIG. 10, the paths S45 and 55 and the paths S43 and S53 cannot be taken. On the basis of the flowchart according to the present invention, one realizes for the first time that the paths S45 and S55 and the paths s43 and S53 can be taken.

Figure 11:
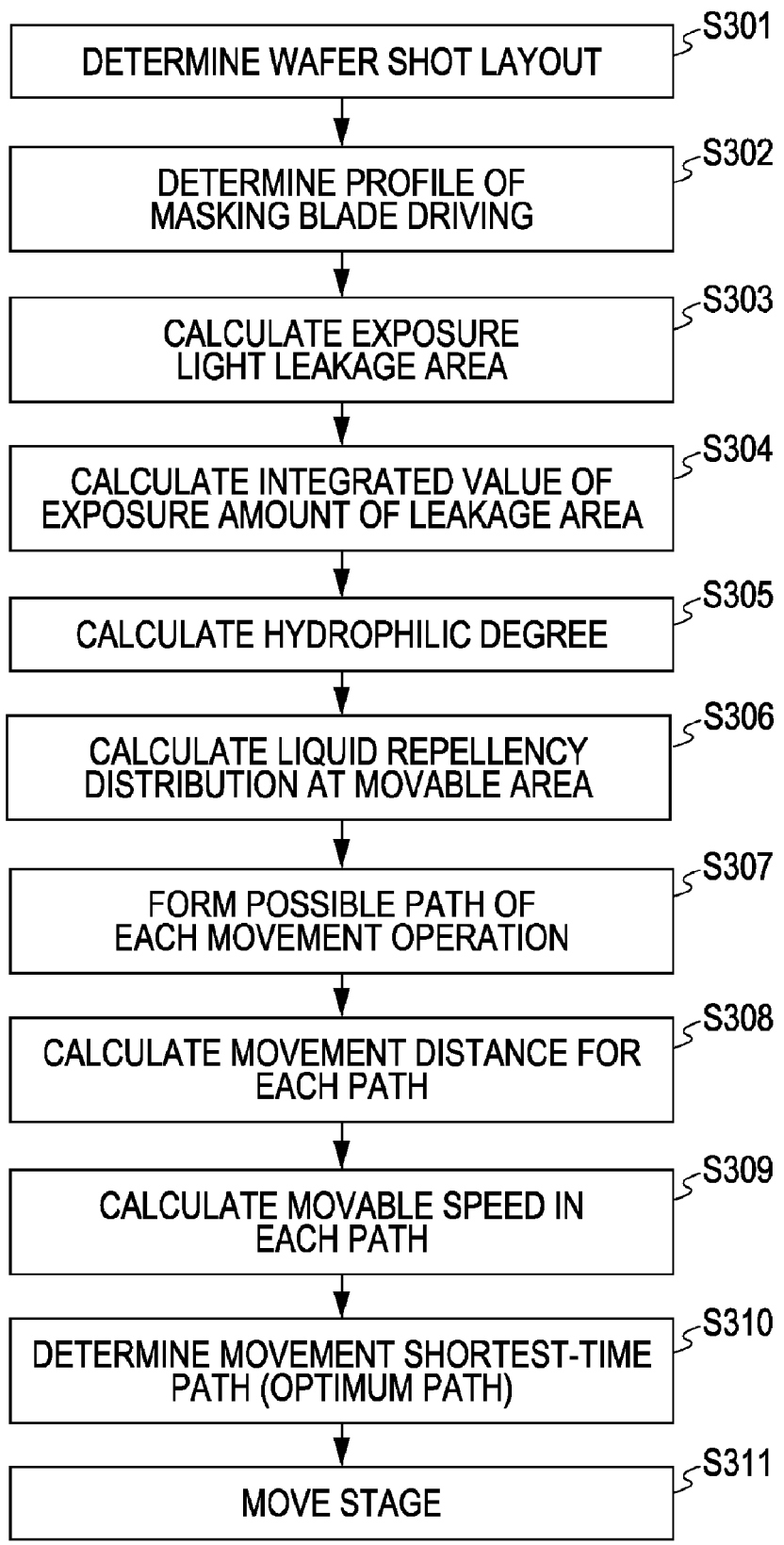
FIG. 11 is a flowchart of steps up to a stage movement step in a second embodiment.

FIG. 11 is a flowchart of steps up to a stage movement step in the second embodiment.

First, in Step S301, a layout of shots of the wafer 40 is determined. Then, in Step S302, a driving profile of the masking blade 15 is determined on the basis of the shot layout. An area of exposure-light leakage with respect to the coplanar plate 41 is specified on the basis of the profile. The exposure-light leakage area is such that the liquid repellency changes on the basis of an integrated value of irradiation of exposure light. For example, if a liquid-repellency treatment is previously performed, when the irradiation integrated value is small, the liquid repellency is maintained high, whereas, when the irradiation integrated value is increased, the liquid repellency is reduced, thereby resulting in a hydrophilized state. Therefore, in Step S304, the integrated value of irradiation of the exposure-light leakage area is calculated. In Step S305, on the basis of this value, the hydrophilic degree of the exposure-light leakage area is calculated. Then, in Step S306, the liquid-repellency distribution is prepared on the basis of the liquid repellency of the exposure-light leakage area, and the liquid repellency at the wafer and the liquid repellency at the coplanar plate, which are previously set. Thereafter, possible paths of respective movements are provided in Step S307, and movement distances of the respective possible paths are calculated in Step S308. Next, in Step S309, movement limit speeds are calculated on the basis of the relationship shown in FIG. 6 and on the basis of the liquid-repellency information and the movement distances of the respective possible movement paths. Then, in Step S310, the path that can be passed through in the shortest time is selected on the basis of the movement distances and the movement limit speeds of the respective possible movement paths. Thereafter, in Step S311, the stage is moved along the path.

The flowchart of calculating the path according to the present invention is discussed using FIG. 11. The whole flowchart may be incorporated on-line in the exposure apparatus. Alternatively, at least some of the steps of the flowchart may be calculated on-line to reflect these calculations in the movement of the stage. For example, if it is clear, from a previous calculation, that the exposure-light area substantially does not change even if the structure of the wafer layout changes, when on-line, the stage may be set so as to pass at all times through S45, S55, S43, or S53.

Third Embodiment

A third embodiment will now be described with reference to FIG. 15. The third embodiment provides movement paths of a liquid-immersion area when the first and second embodiments are combined.

Figure 15:
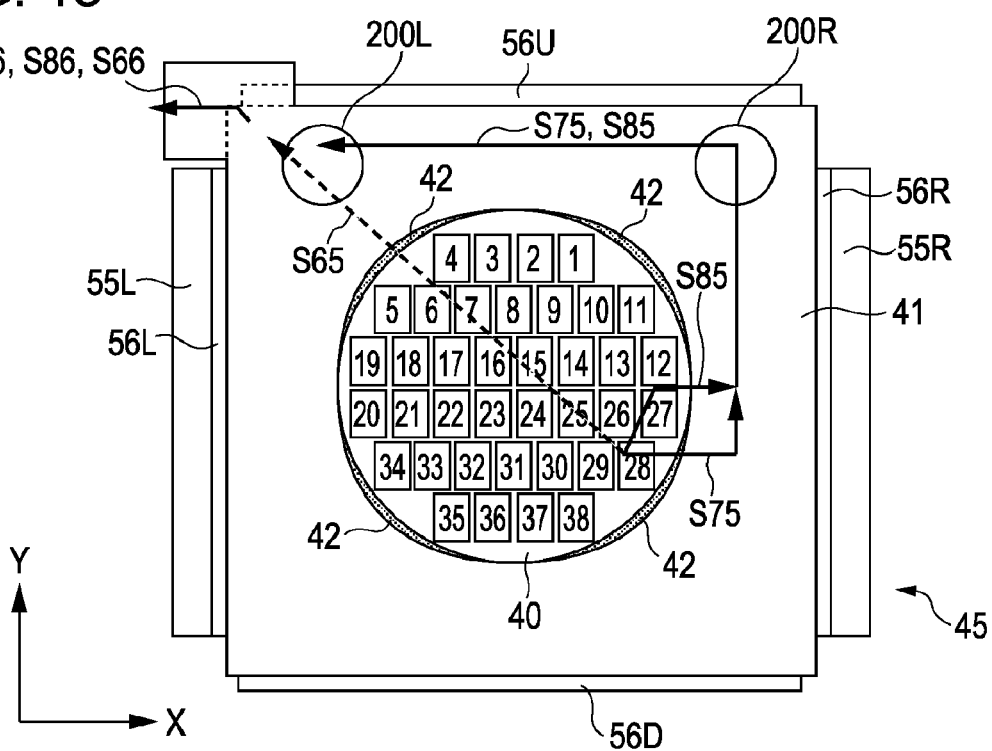
FIG. 15 shows still another exemplary stage movement path.

FIG. 15 shows movement paths when movement is performed from near a portion below a 26th shot to a liquid-immersion transfer area, when the liquid-repellency distribution is like that shown in FIG. 12. A path S65, which is indicated by a broken line, is an exemplary path in accordance with the related flowchart based on FIG. 10. Paths S75 and S85, which are indicated by solid lines, are exemplary paths in accordance with the flowchart according to the present invention and based on FIG. 4. According to the related flowchart of FIG. 10, the speed of a stage is set at a maximum speed regardless of the path. Accordingly, an example of a shortest-time path is one, such as the path S65, extending through a path formed by a straight line connecting a movement starting point and a movement end point. However, it can be understood that, since the liquid repellency at the surface of a wafer is lower than that at the coplanar plate, the movement is forced to be performed at a lower speed than that at the coplanar plate from the relationship shown in FIG. 6. Therefore, the path S75 or the path S85, extending around the wafer, becomes a possible path. If the ratio of increase of the limit speed at the path S75, which is based on the difference between the liquid repellency at the wafer and that at the coplanar plate, is larger than the ratio between the path distances of S65 and S75 or S85, S75 will be the path that can be moved through in a short time. For example, if the ratio between the distance of S75 and the distance of S65 is 1.5×, and the limit speed ratio due to a difference between the liquid repellencies is 2×, the path S75 can be passed through in a time that is 0.75× of the time taken to pass through the path S65. Therefore, the path S75 is an optimum path. Up to this point of the discussion, attention has been paid to the difference between the liquid repellency at the entire coplanar plate and that at the wafer. Next, considering a portion where the liquid-repellency is reduced due to exposure-light irradiation leakage (hydrophilic portion), an optimum path is further determined. That is, which of the paths S75 and S85 becomes the possible path is determined by how the stage passes the outer peripheral portion of the wafer. Even here, from the relationship shown in FIG. 6, movement can be performed at a higher speed when the liquid-repellency reducing portion (hydrophilic portion) is not passed. Accordingly, also considering the amount of increase in the movement distance, the shortest-time path is selected. Conducting investigations under various conditions in this way, if the liquid repellency at the wafer is smaller than that at the coplanar plate, either S75 or S85 is almost always the shortest-time path. Therefore, at the actual apparatus, either the path S75 or the path S85 may be set when the conditions do not change considerably, instead of determining a movement path each time after these investigations.

Here, as a matter of convenience for discussion, the paths are represented as S85 and S86. However, this does not necessarily mean stoppage at the terminal point of S85. Accordingly, a connecting movement may be made at a constant speed between the paths S85 and S86. The movement paths here are defined by a speed profile in addition to a movement locus. Therefore, movement may be stopped at the terminal point of the path S85 if the movement time in the entire path is short. In contrast, the movement may be continued without stopping the movement, if the movement time when performing the connecting movement to the path S86 without stopping the movement is short. In either case, the difference lies in determining an optimum path on the basis of to what degree the details of the relationship in FIG. 6 is followed.

Fourth Embodiment

Next, with reference to FIGS. 16 and 17, a method of manufacturing a device using the above-described immersion exposure apparatus 1 will be described. FIG. 16 shows a flowchart for illustrating a method of manufacturing a device (for example, a semiconductor chip, such as an IC or an LSI, an LCD, or a CCD sensor). Here, a method of manufacturing a semiconductor chip will be taken as an example. In Step S1, the circuit of the device is designed. Then, in Step S2, reticles having the designed circuit pattern formed thereon are produced. Then, in Step S3, a wafer is produced using silicon or other such material. In Step S4 (a wafer process step), which is called a pre-processing step, a reticle and the wafer are used to form the actual circuit onto the wafer using lithography techniques according to the present invention. Then, in Step S5, which is called a post-processing step, the wafer that has been formed in Step S4 is formed into a semiconductor chip, wherein assembly (dicing, bonding), packaging (of the chip), and the like are performed. In Step S6, the semiconductor device that has been prepared in Step S5 is inspected by conducting an operation confirmation test and a durability test. Thereafter, in Step S7, the semiconductor device is shipped.

FIG. 17 is a flowchart showing the above-described wafer process in more detail. In Step S11, the surface of the wafer is oxidized. Then, in Step S12 (chemical-vapor deposition (CVD) step), an insulation film is formed on the surface of the wafer. In Step S13, an electrode is formed on the wafer by, for example, evaporation. In Step S14, ions are implanted into the wafer. In Step S15, a photosensitization agent is applied to the wafer. In Step S16, a reticle pattern is exposed to the wafer by the immersion exposure apparatus 1. In Step S17, the exposed wafer is developed. In Step S18, portions other than where the developed resist image is formed are etched. In Step S19, any unnecessary resist is removed from the wafer, after the etching is performed. Multiple circuit patterns are formed on the wafer by repeating the above-described steps. According to the device manufacturing method, it is possible to manufacture a device having a higher quality than that of a related device. Accordingly, the present invention includes, as one aspect, a device manufacturing method using the immersion exposure apparatus 1 and a device that is manufactured as a result of performing the method.

In the foregoing description, the term liquid repellency has been used. An example of a measure of the liquid repellency of a particular substrate surface and liquid system is the contact angle formed when a drop of the liquid is formed on the substrate surface. The larger the contact angle, the higher the liquid repellency of the surface. For example, if the liquid is water, the surface is said to be hydrophobic if the contact angle is greater than 90 degrees, and hydrophilic if the contact angle is less than 90 degrees. The contact angle observed in a given liquid/substrate system is related to the adhesion energy per unit area of the surface and the surface tension of the liquid through the Young-Dupre equation. It is clear that in the embodiments described above, it is advantageous for the coplanar plate surrounding the wafer to have a surface having a larger contact angle for a given immersion liquid than the substrate, so that the limit speed over the coplanar plate is higher than over the wafer.

In summary, the present invention provides a method of optimizing a liquid immersion photolithography process for a step and scan or step and repeat exposure tool having a moveable substrate stage, the method including providing information on how the immersion liquid repellency of the surface of the substrate and/or stage varies as a function of position; determining the required layout of exposures on the substrate; determining two or more possible paths through which the substrate stage can be moved to expose the required layout; determining the limit speed with which the stage can be moved for each part of each possible path, based on the liquid repellency of the underlying part of the substrate and/or stage; calculating for each path the time taken to complete exposure of the required layout; choosing the path taking the shortest time; and controlling the stage to move along the chosen path.

Although the present invention is described with reference to preferred embodiments, the present invention is obviously not limited to these exemplary embodiments, so that various modifications and changes can be made within the scope of the claims.

While the present invention has been described with reference to exemplary embodiments, it is to be understood that the invention is not limited to the disclosed exemplary embodiments, so that the scope of the following claims is to be accorded the broadest interpretation so as to encompass all modifications, equivalent structures and functions.

This application claims the benefit of Japanese Application No. 2006-305242 filed Nov. 11, 2006, which is hereby incorporated by reference herein in its entirety.

What is claimed is:

1. A liquid-immersion exposure method, comprising:
determining a movement path of a stage, on the basis of a liquid-repellency distribution at a substrate, which a liquid contacts, and at a surface of a member, provided around an outer periphery of the substrate,
wherein determining the movement path includes forming a first possible path and a second possible path, and selecting either the first possible path or the second possible path, depending on whichever has a shorter movement time; and
moving the stage in accordance with the movement path.

2. The method according to claim 1, wherein the movement path is determined so that a movement time of the stage is shorter than a movement time when the stage moves on a straight line connecting a movement starting point and a movement end point.

3. The method according to claim 1, wherein determining the movement path includes determining the limit speed of the stage, on the basis of the liquid-repellency distribution, and determining the movement path of the stage on the basis of the limit speed.

4. The method according to claim 1, wherein the liquid-repellency distribution is calculated on the basis of an exposure integrating time.

5. The method according to claim 1, further including,
forming an exposure layout of the substrate;
forming a plurality of possible paths in which the stage moves, on the basis of the exposure layout;
calculating movement distances for when the stage is moved in accordance with the possible paths;
calculating the liquid repellency distribution at the substrate, which the liquid contacts, and at the surface of the member, provided around the substrate;
selecting, from among the plurality of possible paths, a path in which the stage passes in the shortest movement time, on the basis of the liquid repellency distribution and the movement distances; and
moving the stage in accordance with the selected path.

6. The liquid-immersion exposure method according to claim 5, wherein, in the selecting step, the path in which the stage passes in the shortest movement time is selected from the plurality of possible paths.

7. The liquid-immersion exposure method according to claim 5, wherein, in the distribution calculating step, the liquid-repellency distribution is calculated on the basis of an exposure integrating amount.

8. The method according to claim 1, wherein a liquid-repellency distribution at a surface of a member, provided around an outer periphery of the substrate, is calculated on the basis of an integrated value of irradiation of exposure light onto the surface of the member provided around the outer periphery of the substrate.

9. A liquid-immersion method, comprising:
determining a movement path of a stage on the basis of a limit speed of the stage that is in accordance with an area which a liquid contacts,
wherein determining the movement path includes forming a first possible path and a second possible path, and selecting either the first possible path or the second possible path, depending on whichever has a shorter movement time; and
moving the stage in accordance with the movement path.

10. The method according to claim 9, wherein the movement path is determined so that a movement time of the stage is shorter than a movement time when the stage moves on a straight line connecting a movement starting point and a movement end point.

11. A liquid-immersion exposure method in a liquid-immersion exposure apparatus where a stage is moved with a liquid having been supplied during non-exposure, to transfer the liquid from the stage to another member, the method comprising:
determining a movement path of the stage so that an area of a locus of the liquid passing within a substrate when the liquid moves from a final exposure shot area of the substrate to a liquid transfer portion outside the substrate is smaller than an area of a locus of the liquid passing within the substrate when the liquid passes a straight line connecting the final exposure shot area and the liquid transfer portion; and
moving the stage on the basis of the path.

12. The liquid-immersion exposure method according to claim 11, wherein the center of gravity of an area which the liquid contacts is withdrawn from the substrate so as to move along an imaginary line extending radially from the center of the substrate.

13. The liquid-immersion exposure method according to claim 11, further including,
determining a path of the stage so as to avoid contact of the liquid with a surface of the substrate; and
moving the stage on the basis of the path.

14. The liquid-immersion exposure method according to claim 11, further including,
withdrawing the center of gravity of an area which the liquid contacts from the substrate;
determining a path of the stage so that the center of gravity of the area which the liquid contacts does not pass within the substrate; and
moving the stage on the basis of the path.

15. The liquid-immersion exposure method according to claim 14, wherein, in the withdrawing step, the center of gravity of the area which the liquid contacts is withdrawn from the substrate so as to move along an imaginary line extending radially from the center of the substrate.

16. A liquid-immersion exposure method in a liquid-immersion exposure apparatus including a member provided on a stage so as to surround an outer periphery of a substrate, the stage being moved with a liquid having been supplied during non-exposure in the liquid-immersion exposure apparatus, the method comprising:
determining a movement path of the stage so that, when an area which the liquid contacts is provided on both sides of the outer periphery of the substrate, the area passes along a path extending in a light-shielding direction of a light-shielding member from the center of the substrate; and
moving the stage in accordance with the movement path.

17. The method according to claim 16, wherein the light-shielding direction corresponds to a scanning direction and a direction perpendicular to the scanning direction, the stage being scanned and driven in the scanning direction during exposure.

18. A liquid-immersion exposure apparatus that forms a pattern onto a substrate through a liquid by exposure, the apparatus comprising:
a stage that moves with the substrate being placed thereon;
a projection optical system that projects the pattern onto the substrate; and
a liquid supplying unit that locally supplies the liquid to and recovers the liquid from a portion between the projection optical system and the stage,
wherein a first possible path and a second possible path are formed on the basis of a limit speed of the stage corresponding to an area which the liquid contacts on the stage, and a movement path of the stage is set to be either the first possible path or the second possible path, depending on whichever has a shorter movement time.

19. A liquid-immersion exposure method in a liquid-immersion exposure apparatus that forms a pattern onto a substrate through a liquid by exposure, the apparatus including: a stage that moves with the substrate being placed thereon; a projection optical system that projects the pattern onto the substrate; and a liquid supplying unit that locally supplies the liquid to and recovers the liquid from a portion between the projection optical system and the stage, the method comprising:
determining a movement path of a stage, on the basis of a liquid-repellency distribution at a substrate, which a liquid contacts, and at a surface of a member, provided around an outer periphery of the substrate,
wherein the movement path is determined so that a movement time of the stage is shorter than a movement time when the stage moves on a straight line connecting a movement starting point and a movement end point with the liquid being held by the liquid supplying unit; and
moving the stage in accordance with the movement path.

20. The method according to claim 19, wherein the movement path is determined so that a movement time of the stage is shorter than a movement time obtained from a distance of the straight line connecting the movement starting point and the movement end point and a liquid-repellency distribution at an area which the liquid contacts when the stage moves on the straight line connecting the movement starting point and the movement end point.

21. A liquid-immersion exposure method in a liquid-immersion exposure apparatus that forms a pattern onto a substrate through a liquid by exposure, the apparatus including: a stage that moves with the substrate being placed thereon; a projection optical system that projects the pattern onto the substrate; and a liquid supplying unit that locally supplies the liquid to and recovers the liquid from a portion between the projection optical system and the stage, the method comprising:
determining a movement path of a stage, on the basis of a liquid-repellency distribution at a substrate, which a liquid contacts, and at a surface of a member, provided around an outer periphery of the substrate,
wherein determining the movement path includes forming a first possible path and a second possible path, and selecting either the first possible path or the second possible path, depending on whichever has a shorter movement time; and
moving the stage in accordance with the movement path.

22. A liquid-immersion exposure method in a liquid-immersion exposure apparatus that forms a pattern onto a substrate through a liquid by exposure, the apparatus including: a stage that moves with the substrate being placed thereon; a projection optical system that projects the pattern onto the substrate; and a liquid supplying unit that locally supplies the liquid to and recovers the liquid from a portion between the projection optical system and the stage, the method comprising:
forming a plurality of possible paths in which the stage moves, on the basis of an exposure layout of the substrate;
calculating movement times for the respective possible paths, on the basis of movement distances for the respective possible paths and a liquid-repellency distribution on the possible paths;
determining a movement path in which the stage passes in the shortest movement time from among the calculated movement times for the respective possible paths; and
moving the stage on the basis of the determined movement path.

23. A liquid-immersion exposure method in a liquid-immersion exposure apparatus that forms a pattern onto a substrate through a liquid by exposure, the apparatus including: a stage that moves with the substrate being placed thereon; a projection optical system that projects the pattern onto the substrate; and a liquid supplying unit that locally supplies the liquid to and recovers the liquid from a portion between the projection optical system and the stage, the method comprising:
determining a movement path of a stage, on the basis of a limit speed of the stage that is in accordance with an area which a liquid contacts,
wherein the determining the movement path includes forming a first possible path and a second possible path, and selecting either the first possible path or the second possible path, depending on whichever has a shorter movement time for the stage to move along at the limit speed; and
moving the stage in accordance with the movement path.

* * * * *